(12) United States Patent
Cho et al.

(10) Patent No.: US 12,369,253 B2
(45) Date of Patent: Jul. 22, 2025

(54) CIRCUIT AND CONNECTOR ELEMENT ALIGNMENT, CIRCUIT BOARD ASSEMBLIES

(71) Applicant: Infineon Technologies Austria AG, Villach (AT)

(72) Inventors: Eung San Cho, Torrance, CA (US); Danny Clavette, Greene, RI (US)

(73) Assignee: Infineon Technologies Austria AG, Villach (AT)

( * ) Notice: Subject to any disclaimer, the term of this patent is extended or adjusted under 35 U.S.C. 154(b) by 265 days.

(21) Appl. No.: 17/952,895

(22) Filed: Sep. 26, 2022

(65) Prior Publication Data

US 2024/0107674 A1 Mar. 28, 2024

(51) Int. Cl.
| | | |
|---|---|---|
| H05K 1/18 | (2006.01) | |
| H02M 3/00 | (2006.01) | |
| H05K 1/11 | (2006.01) | |
| H05K 1/14 | (2006.01) | |
| H05K 3/00 | (2006.01) | |
| H05K 3/30 | (2006.01) | |
| H05K 3/36 | (2006.01) | |
| H02M 3/158 | (2006.01) | |

(52) U.S. Cl.
CPC ............. *H05K 1/18* (2013.01); *H02M 3/003* (2021.05); *H05K 1/117* (2013.01); *H05K 1/141* (2013.01); *H05K 1/145* (2013.01); *H05K 3/0052* (2013.01); *H05K 3/30* (2013.01); *H05K 3/366* (2013.01); *H02M 3/1584* (2013.01); *H05K 2201/047* (2013.01); *H05K 2201/09145* (2013.01); *H05K 2201/10015* (2013.01); *H05K 2201/1003* (2013.01); *H05K 2201/1053* (2013.01)

(58) Field of Classification Search
CPC ......... H05K 1/18; H05K 1/117; H02M 3/003; H02M 3/1584
USPC ......................................................... 361/782
See application file for complete search history.

(56) References Cited

U.S. PATENT DOCUMENTS

| | | | | |
|---|---|---|---|---|
| 2006/0292898 A1* | 12/2006 | Meredith | ............... | H05K 3/325 |
| | | | | 439/65 |
| 2008/0285242 A1* | 11/2008 | Charny | ................. | H05K 1/0271 |
| | | | | 361/749 |
| 2010/0151703 A1* | 6/2010 | Shibao | ................... | H05K 1/025 |
| | | | | 29/846 |
| 2016/0268034 A1* | 9/2016 | Subat | ..................... | H05K 3/366 |

(Continued)

OTHER PUBLICATIONS

Extended Search Report, EP 23 19 0469, Feb. 13, 2024, pp. 1-7.

*Primary Examiner* — Andargie M Aychillhum
(74) *Attorney, Agent, or Firm* — Armis IP Law, LLC

(57) ABSTRACT

This disclosure includes multiple assemblies, sub-assemblies, etc., as well as one or more methods of fabricating same. For example, a first assembly includes a first circuit board. The first circuit board further includes first connector elements disposed on a first edge of the first circuit board and second connector elements disposed on a second edge of the first circuit board. The first edge may be disposed substantially opposite the second edge on the first circuit board. The apparatus may further include first circuitry affixed to the first circuit board. The first edge of the first circuit board aligns with a first axial end of the first circuitry and the second edge of the first circuit board aligns with a second axial end of the first circuitry. The first assembly is used to fabricate a second assembly.

27 Claims, 13 Drawing Sheets

(56) References Cited

U.S. PATENT DOCUMENTS

2017/0118839 A1* 4/2017 Brunschwiler ........ H05K 3/403
2022/0263421 A1* 8/2022 Yu ........................... H05K 1/14

* cited by examiner

CIRCUIT AND CONNECTOR ELEMENT ALIGNMENT, CIRCUIT BOARD ASSEMBLIES

BACKGROUND

A printed circuit board (PCB) or printed wiring board is a laminated structure of conductive layers separated by insulating layers. In general, PCBs have two functions. The first is to secure electronic components at designated locations on the outer layers by means of soldering. The electronic circuit instantiated by the populated circuit board is designed to provide one or more specific functions. After fabrication, the electronic circuit is powered to perform the desired functions.

Typically, a printed circuit board is a planar device on which multiple components are interconnected via traces to provide the functions as previously discussed. Such implementations of fabricating circuitry on a planar circuit board assembly is dimensionally limited.

BRIEF DESCRIPTION

Implementation of clean energy (or green technology) is very important to reduce our impact as humans on the environment. In general, clean energy includes any evolving methods and materials to reduce an overall toxicity of energy consumption on the environment.

This disclosure includes the observation that raw energy, such as received from green energy sources or non-green energy sources, typically needs to be converted into an appropriate form (such as desired AC voltage, DC voltage, etc.) before it can be used to power end devices such as servers, computers, mobile communication devices, etc. Regardless of whether energy is received from green energy sources or non-green energy sources, it is desirable to make most efficient use of raw energy provided by such systems to reduce our impact on the environment. This disclosure contributes to reducing our carbon footprint (and green energy) via more efficient energy conversion and circuit implementations supporting same.

As discussed herein, a fabricator produces one or more assemblies to provide higher density circuitry than provided by conventional instantiation of circuitry on planar circuit boards.

More specifically, this disclosure includes an apparatus, systems, methods, etc. The apparatus such as a first assembly may include a first circuit board. The first circuit board includes first connector elements disposed on a first edge of the first circuit board and second connector elements disposed on a second edge of the first circuit board. The first edge may be disposed substantially opposite the second edge on the first circuit board. The apparatus further includes first circuitry affixed to the first circuit board. The first edge of the first circuit board and corresponding first connector elements align with a first axial end of the first circuitry and the second edge and corresponding connector elements align with a second axial end of the first circuitry.

The first circuitry affixed to the first circuit board may be implemented as an inductor device. The inductor device may be fabricated to include an electrically conductive path and magnetic permeable material. The electrically conductive path may be electrically conductive material extending between the first axial end of the first circuitry and the second axial end of the first circuitry; the electrically conductive path of the inductor device may be enveloped by the magnetic permeable material.

Note further that the electrically conductive path may be implemented in any manner such as via a cylindrical body fabricated from the electrically conductive material. An axis disposed along a length a center of the cylindrical body between the first axial end and the second axial end may be substantially parallel to a plane in which the first circuit board resides.

Note that the cross sectional areas/regions of the electrically conductive path may be enlarged (widened) at each of the first axial end and the second axial end of the inductor device with respect to a cross sectional area of the electrically conductive path at a location between the first axial end and the second axial end of the inductor device.

The first circuitry such as an inductor device may be affixed to the first circuit board in any suitable manner. For example, the apparatus may further include a layer of material (such as adhesive) disposed between the magnetic permeable material or outer surface of the inductor device and a surface of the first circuit board. The layer of material affixes the inductor device to the first circuit board.

The first circuitry affixed to the first circuit board may include a series connection of multiple components such as an inductor device and power converter circuitry connected between the first axial end and the second axial end of the first circuit.

Each of the surfaces associated with the first circuit board may be populated with one or more circuit components. For example, the first circuitry may be affixed to a first surface of the first circuit board; one or more supplemental circuit components may be coupled to a second surface of the first circuit board. The second surface is disposed substantially opposite the first surface.

Note further that a combination of the first edge of the first circuit board, the first axial end of the first circuitry, and a first axial end of the second circuitry may reside in a first plane; a combination of the second edge of the first circuit board, the second axial end of the first circuitry, and a second axial end of the second circuitry may reside in a second plane. The first plane may be disposed substantially parallel to the second plane. The first assembly (apparatus) as discussed herein may further include circuit paths. For example, the first assembly may include first circuit paths extending between a first portion of the first connector elements on the first edge and a first portion of the second connector elements on the second edge. In such an instance, the first circuit paths are disposed in the first circuit board adjacent the first circuitry. The first assembly may further include second circuit paths extending between a second portion of the first connector elements on the first edge and a second portion of the second connector elements on the second edge. The second circuit paths may be disposed in or on the first circuit board adjacent the second circuitry.

Yet further, the first assembly may include one or more sub-circuits (such as semiconductor chips, discrete components, etc.) embedded in the first circuit board.

The first assembly may further include a sequence of multiple circuit components disposed between the first axial end of the first circuitry and the second axial end of the first circuitry; the multiple circuit components may include a first component, a second component, and a third component.

Each of the first connector elements on the first edge of the first circuit board may include a respective cavity; each of the second connector elements on the second edge of the connector elements may include a respective cavity.

As further discussed herein, a second assembly includes the first assembly as previously discussed as well as a first substrate and a second substrate. The first conductive elements on the first edge of the first assembly may be connected to the first substrate; the first axial end of the first circuitry may be connected to the first substrate; the second conductive elements on the second edge may be connected to the second substrate; the second axial end of the first circuitry may be connected to the second substrate. Yet further, the first substrate may be disposed substantially parallel to the second substrate; the first circuit board may be disposed substantially parallel to a second circuit board adjacent to the first circuit board; and both the first circuit board and the second circuit board may be disposed substantially orthogonal to the first substrate or the second substrate.

Yet a further example as discussed herein includes a method of fabricating the first assembly. The method may include: receiving a first circuit board including a first sequence of first connector elements and a second sequence of second connector elements; and affixing first circuitry to the first circuit board, a first axial end of the first circuitry being fixedly aligned with respect to the first connector elements on the circuit board and a second axial end of the first circuitry being fixedly aligned with respect to the second connector elements on the circuit board.

The method may further include fabricating the first circuit board to include the first sequence of first connector elements and the second sequence of second connector elements.

Yet further, the method may include: cutting the first circuit board along an axis of the first connector elements to produce a first edge of the first circuit board; and cutting the first circuit board along an axis of the second connector elements to produce a second edge of the first circuit board. The first circuit board may be cut such that the first edge of the first circuit board is aligned (or eventually aligned) with a first axial end of the first circuitry and the second edge of the first circuit board is aligned (or eventually aligned) with a second axial end of the first circuitry. The first edge may be disposed opposite the second edge on the first circuit board.

As previously discussed, the first circuitry affixed to the first circuit board may be an inductor device fabricated to include an electrically conductive path and magnetic permeable material. The electrically conductive path may be electrically conductive material extending between the first axial end of the first circuitry and the second axial end of the first circuitry. The electrically conductive material of the inductor device may be enveloped by the magnetic permeable material. Cross sectional areas of the electrically conductive paths may be enlarged or enhanced at the first axial end and the second axial end with respect to a cross sectional area of the electrically conductive path at a location disposed between the first axial end and the second axial end.

Still further, the first circuitry affixed to the first circuit board may include an inductor device and power converter circuitry disposed in series; the power converter circuitry may be operative to control a flow of current through an electrically conductive core of the inductor device.

The method as further discussed herein may include affixing the first circuitry to a first surface of the first circuit board; and affixing second circuitry to a second surface of the first circuit board, the second surface disposed opposite the first surface.

The method as further discussed herein may include: fabricating the first circuit board to include the first connector elements disposed on a first edge; fabricating the second circuit board to include the second connector elements disposed on a second edge; and affixing the second circuitry to the first circuit board. A combination of a first edge of the first circuit board including the first connector elements, first axial end of the first circuitry, and first axial end of the second circuitry may reside in a first plane; and a combination of a second edge of the first circuit board including the second connector elements, second axial end of the first circuitry, and second axial end of the second circuitry may reside in a second plane. The first plane may be parallel to the second plane.

As previously discussed, the first circuit board may include a chip or other circuitry embedded in the first circuit board.

The method may further include fabricating the first circuitry to include a sequence of multiple circuit components including a series connection of a first component, a second component, and a third component.

The methods as discussed herein may further include: fabricating each of the first connector elements on a first edge of the first circuit board to include a respective cavity or other suitable shape; and fabricating each of the second connector elements on a second edge of the connector elements to include a respective cavity or other suitable shape.

The method may further include fabrication of a second assembly. For example, the method may include fabricating a second assembly to include: the first assembly; a first substrate; and a second substrate. The method may further include: connecting the first conductive elements to the first substrate; connecting the first axial end of the first circuitry to the first substrate; connecting the second conductive elements to the second substrate; and connecting the second axial end of the first circuitry to the second substrate.

The method may further include: disposing the first substrate to be substantially parallel to the second substrate; and disposing the first circuit board to be substantially orthogonal to both the first substrate and the second substrate.

Note that this disclosure includes useful techniques. For example, in contrast to conventional techniques, the novel circuit as discussed herein provides a way to fabricate high density circuitry.

Note further that any of the resources as discussed herein can include one or more computerized devices, apparatus, hardware, etc., execute and/or support any or all of the method operations disclosed herein. In other words, one or more computerized devices or processors can be programmed and/or configured to operate as explained herein to carry out the different techniques as described herein.

Other aspects of the present disclosure include software programs and/or respective hardware to perform any of the operations summarized above and disclosed in detail below.

Additionally, note that although each of the different features, techniques, configurations, etc., herein may be discussed in different places of this disclosure, it is intended, where suitable, that each of the concepts can optionally be executed independently of each other or in combination with each other. Accordingly, the one or more present inventions as described herein can be embodied and viewed in many different ways.

Also, note that this preliminary discussion of techniques herein (BRIEF DESCRIPTION) purposefully does not specify every novel aspect of the present disclosure or claimed invention(s). Instead, this brief description only presents general aspects and corresponding points of novelty over conventional techniques. For additional details and/or possible perspectives (permutations) of the invention(s), the reader is directed to the Detailed Description section (which is a summary) and corresponding figures of the present disclosure as further discussed below.

Figure 1:
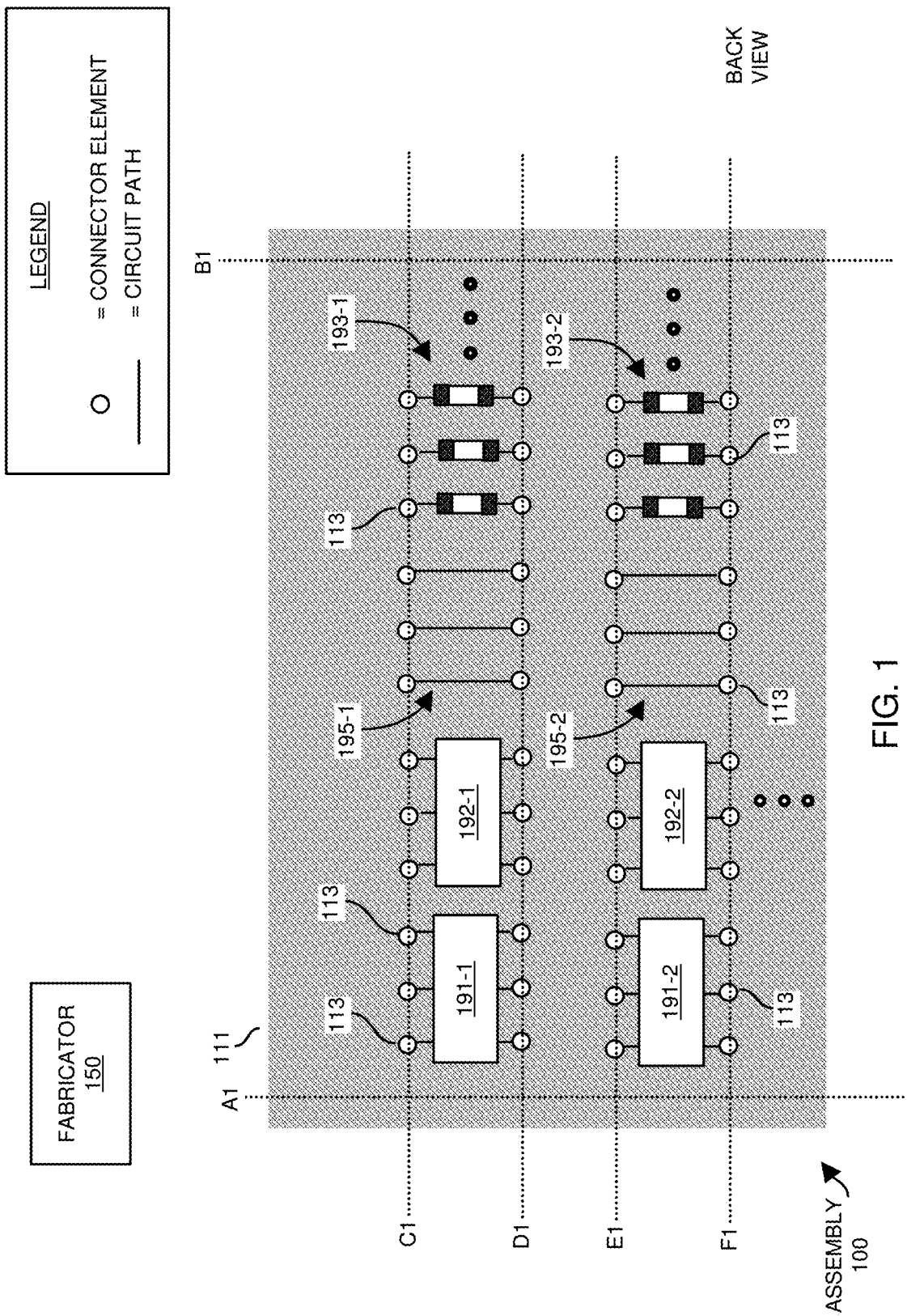
FIG. 1 is an example illustrating fabrication and population of a circuit substrate to produce a circuit assembly as discussed herein.

The foregoing and other objects, features, and advantages of the disclosed matter herein will be apparent from the following more particular description herein, as illustrated in the accompanying drawings in which like reference characters refer to the same parts throughout the different views. The drawings are not necessarily to scale, with emphasis instead being placed upon illustrating the principles, concepts, aspects, techniques, etc.

DETAILED DESCRIPTION

As previously discussed, this disclosure is useful over conventional techniques. For example, in contrast to conventional techniques, the novel assemblies as discussed herein support fabrication of high density circuits (such as power converter circuits).

Now, more specifically, FIG. 1 is an example illustrating fabrication and population of a circuit substrate to produce one or more circuit assemblies as discussed herein.

As shown in FIG. 1, fabricator 150 or other suitable entity fabricates the assembly 101 to include a circuit substrate 111, multiple connector elements 113, circuitry 191 (such as circuitry 191-1, circuitry 191-2, etc.), circuitry 192 (such as circuitry 192-1, circuitry 192-2, etc.), components 193, etc. Note that the circuitry 191, 192, etc., can be configured to include any circuitry supporting any functionality such as power converter control functions.

In this example, the circuit board 111 includes: i) a first sequence of connector elements 113 (such as vias or the like) disposed along axis C1, ii) a second sequence of connector elements 113 disposed along axis D1, iii) a third sequence of connector elements 113 disposed along axis E1, iv) a fourth sequence of connector elements 113 disposed along axis F1, and so on.

Circuit paths 195-1 (such as traces, electrically conductive paths, metal layers, etc.) associated with (on or in layers of) the circuit board 111 provide connectivity of circuitry and nodes such as circuit 191-1, 192-1, etc., between sets of connector elements 113 or between each other. As further discussed herein, note that the circuit paths 195-1 can be configured as thick and/or wide traces or ground planes supporting conveying high current such as a supply voltage current and/or ground path current, signals, etc.

The portion of circuit board 111 between pairs of axes (such as axes pair C1/D1, axes pair E1/F1, and so on) on the circuit board 111 can be populated with any circuit elements with any connectivity from one axis of connector elements to another in the pair. Alternatively, the portions of the circuit board between axes pairs can be populated after subdividing the portions.

For example, as shown, each of one or more connector elements 113 along axis C1 can be connected directly to one or more connector elements on axis D1 (such as a pass-through traces or path); each of one or more connector elements 113 along axis E1 can be connected directly to one or more connector element on axis F1; and so on.

Additionally, one or more circuit paths on the circuit board 111 provide connectivity between connector elements 113 on axis C1 and nodes of circuitry such as circuit 191-1, circuit 191-2, each of components 193-1, etc. As further shown, one or more circuit paths provide connectivity between connector elements 113 on axis D1 and circuitry such as circuit 191-1, circuit 191-2, each of components 193-1, etc.

In general, the connector elements 113 (such as vias or the like fabricated from electrically conductive material such as metal, copper, tin, etc.) may be metallic lined holes (or other shape) connected to circuit paths of the circuit board 111. First connector elements 113 provide connectivity to convey electrical signals between the one or more different layers of the circuit board 111 and/or connectivity from one set of connector elements on a first axis such as axis C1 and second axis such as axis D1. Second connector elements 113 provide connectivity to convey electrical signals between the different one or more layers of the circuit board 111 and/or connectivity from one set of connector elements on a first axis such as axis E1 and second axis such as axis F1.

The fabricator further processes the assembly 101 to produce multiple sub-assemblies. For example, the fabricator 150 cuts along each of the axes A1, B1, C1, D1, E1, F1, etc., to produce the sub-assemblies in FIG. 2.

Figure 2:
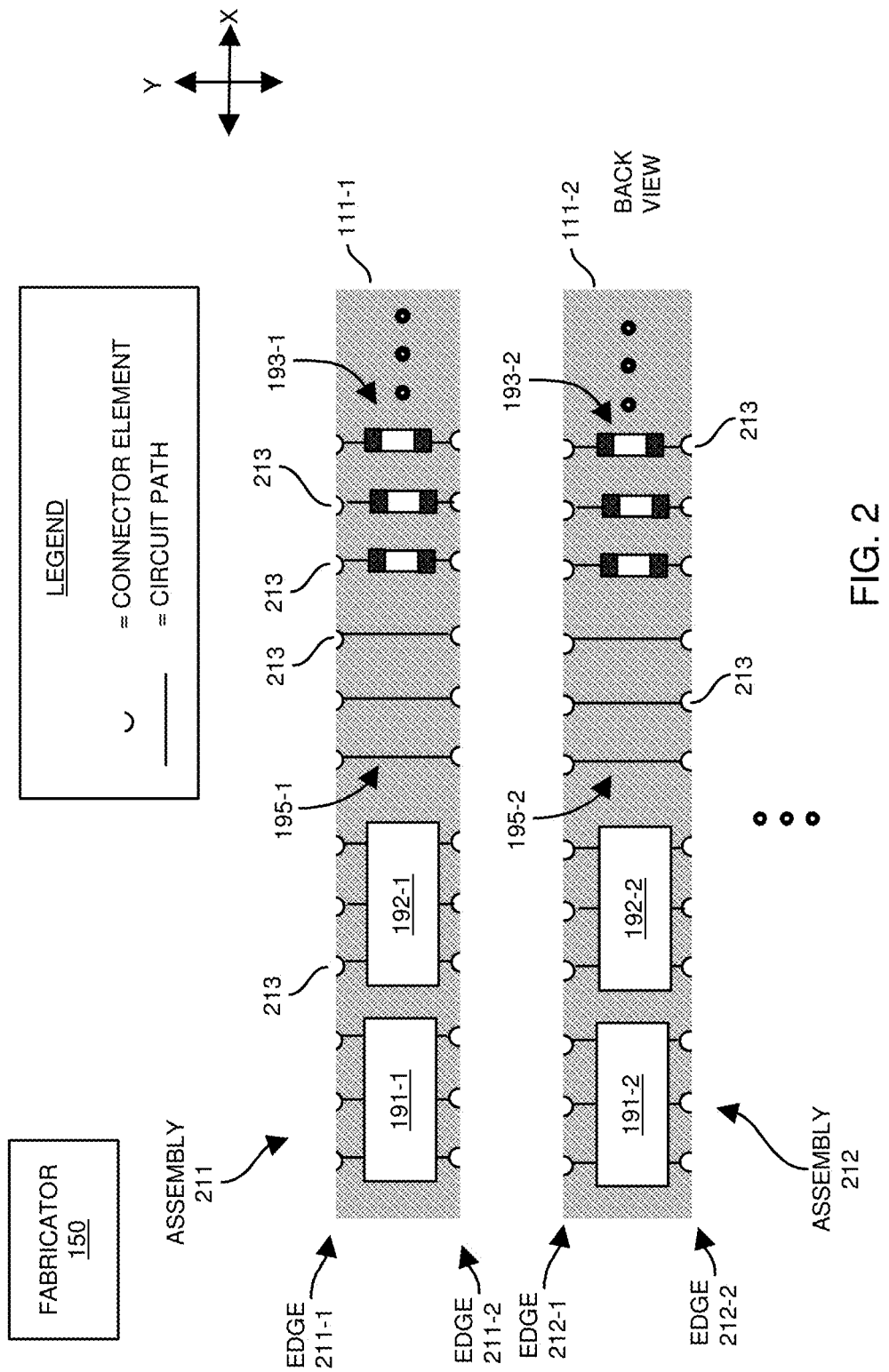
FIG. 2 is an example top view diagram illustrating dicing (a.k.a., cutting, dividing, etc.) of the populated circuit substrate (or unpopulated circuit substrate) to produce multiple sub-assemblies as discussed herein.

FIG. 2 is an example top view diagram illustrating results of dicing (a.k.a., cutting, dividing, etc.) a populated circuit substrate (or unpopulated circuit substrate) to produce multiple sub-assembly components as discussed herein.

As shown FIG. 2, the first assembly 211 may include a first circuit board 111-1 (portion of original circuit board 111). The first circuit board 111-1 includes first connector elements 213 (half of connector elements 113 such as one or more connector elements 113 split from cutting or dividing circuit board 111 into circuit board 111-1) disposed on a first edge 211-1 of the first circuit board 111-1 and second connector elements 213 (one or more connector elements 113 split from cutting circuit board 111 into circuit board 111-1) disposed on a second edge 211-2 of the first circuit board 111-1.

The first edge 211-1 (along axis C1 of FIG. 1) of assembly 211 is disposed substantially opposite the second edge 211-2 (along axis D1 of FIG. 1) on the first circuit board 111-1. The assembly 211 (such as apparatus) further includes, on a back facing shown, circuitry (such as circuitry 191-1, circuitry 192-1, one or more components 193-1, etc.) affixed to a back surface of the first circuit board 111-1 in a manner as previously discussed.

As further shown in FIG. 2, the second assembly 212 may include a circuit board 111-2. The circuit board 111-2 includes first connector elements 213 (one or more connector elements 113 split from cutting or dividing circuit board 111 into circuit board 111-2) disposed on a first edge 212-1 of the circuit board 111-2 and second connector elements 213 (one or more connector elements 113 split from cutting circuit board 111 into circuit board 111-2) disposed on a second edge 212-2 of the circuit board 111-2. The edge 212-1 (along axis E1) of assembly 212 is disposed substantially opposite the second edge 212-2 (along axis F1) on the circuit board 111-2. The assembly 212 (such as apparatus) further includes, on a first facing (such as back facing or surface), circuitry (such as circuitry 191-2, circuitry 192-2, one or more components 193-2, etc.) affixed to the circuit board 111-2 in a manner as previously discussed.

Thus, the circuit board 111 circuit board may be partitioned into multiple different circuit assemblies such as assembly 211, the assembly 212, etc.

Each of the first connector elements 213 on the first edge 211-1 of the first circuit board 111-1 may include a respective cavity as shown; each of the second connector elements 213 on the second edge of the circuit board 111-1 may include a respective cavity. Additionally, or alternatively, the connector elements 213 may be flat along a respective edge, protrude from the edge, etc.

Figure 3:
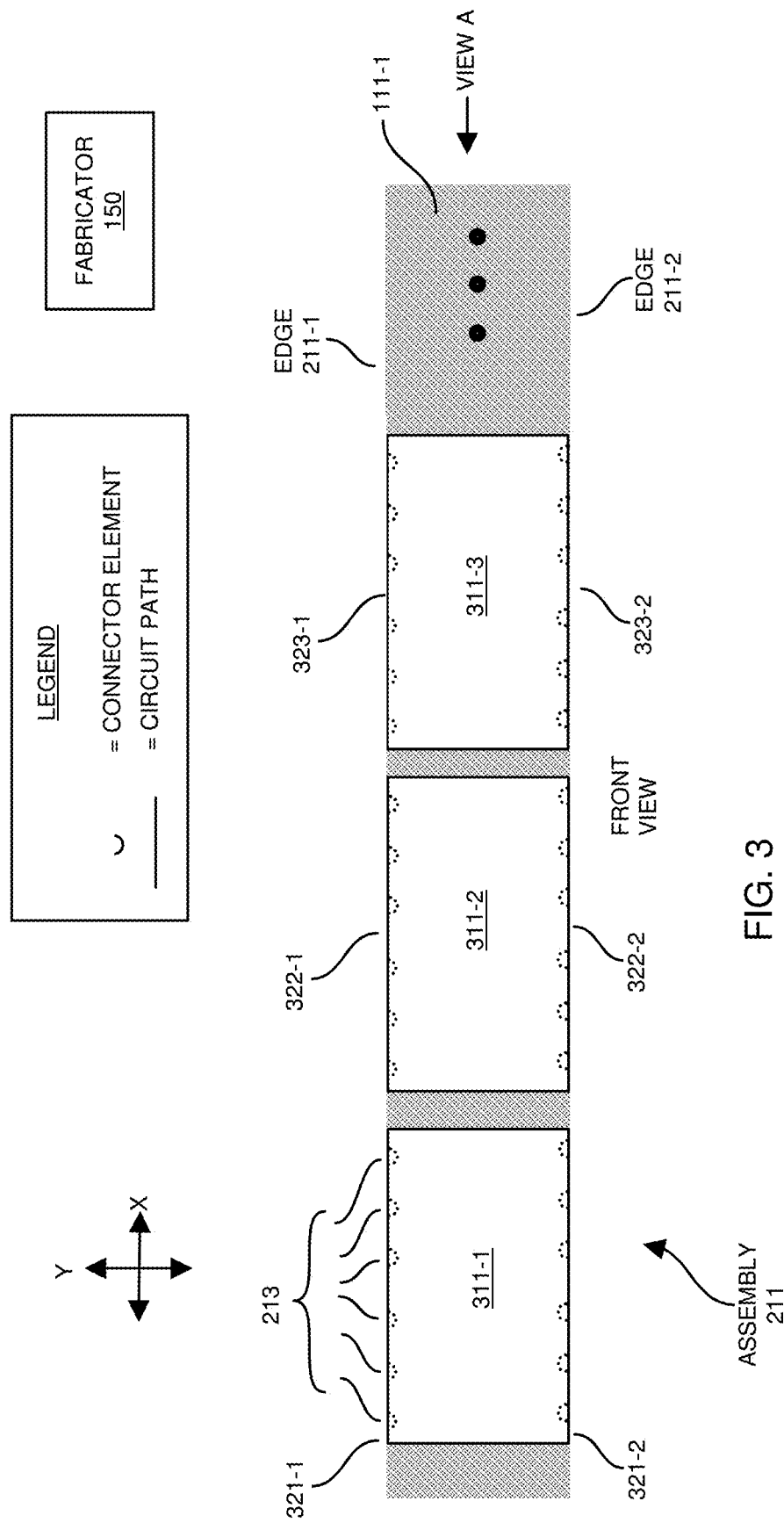
FIG. 3 is an example diagram illustrating a first assembly including alignment of axial ends of first circuitry to edges of a respective host circuit board as described herein.

As further discussed herein, the fabricator 150 can be configured to affix additional circuitry on a second facing (front surface or facing) of each assembly as further discussed in FIG. 3.

FIG. 3 is an example diagram illustrating a first assembly including alignment of axial ends of circuitry to edges of a respective host circuit board as described herein.

In accordance with a further example, the fabricator 150 affixes circuitry (such as one or more circuit components 311-1, 311-2, 311-3, etc.) to a second surface (such as front face or surface or front view) of each of the circuit boards 111-1, 112-1, etc.

More specifically, as shown in FIG. 3, the fabricator 150 affixes the circuitry 311 to the second (front) surface of the circuit board 111-1. In this example, the first edge 211-1 of the first circuit board 111-1 is aligned with a first axial end 321-1 of the first circuitry 311-1 and the second edge 211-2 of the first circuit board 111-1 aligns with a second axial end 321-2 of the first circuitry 311-1. As further discussed herein, this facilitates connectivity of the assembly 212 to a respective host circuit substrate. Alignment facilitates interconnectivity of the assemblies to other circuit boards.

Similarly, the fabricator 150 affixes the circuitry 311-2 to the second surface of the circuit board 111-1. In this example, the first edge 211-1 of the first circuit board 111-1 aligns with a first axial end 322-1 of the circuitry 311-2 and the second edge 211-2 of the circuit board 111-1 aligns with a second axial end 322-2 of the circuitry 311-2.

Yet further, the fabricator 150 affixes the circuitry 311-3 to the second surface of the circuit board 111-1. In this example, the first edge 211-1 of the first circuit board 111-1 aligns with a first axial end 323-1 of the circuitry 311-3 and the second edge 211-2 of the circuit board 111-1 aligns with a second axial end 323-2 of the circuitry 311-3.

In this manner, the fabricator 150 can be configured to affix any circuitry to the front facing (surface) of the circuit board 111-1.

Thus, each of the front and back surfaces associated with the circuit board 111-1 may be populated with one or more circuit components. For example, first circuitry (such as circuitry 311-1, circuitry 311-2, circuitry 311-3, etc.) may be affixed to a first surface of the first circuit board 111-1; one or more supplemental circuit and/or supplemental circuit components (such as 191-1, 192-1, components 193-1, etc.) may be coupled to a second surface of the first circuit board 111-1. The second surface is disposed substantially opposite the first surface.

Figure 4:
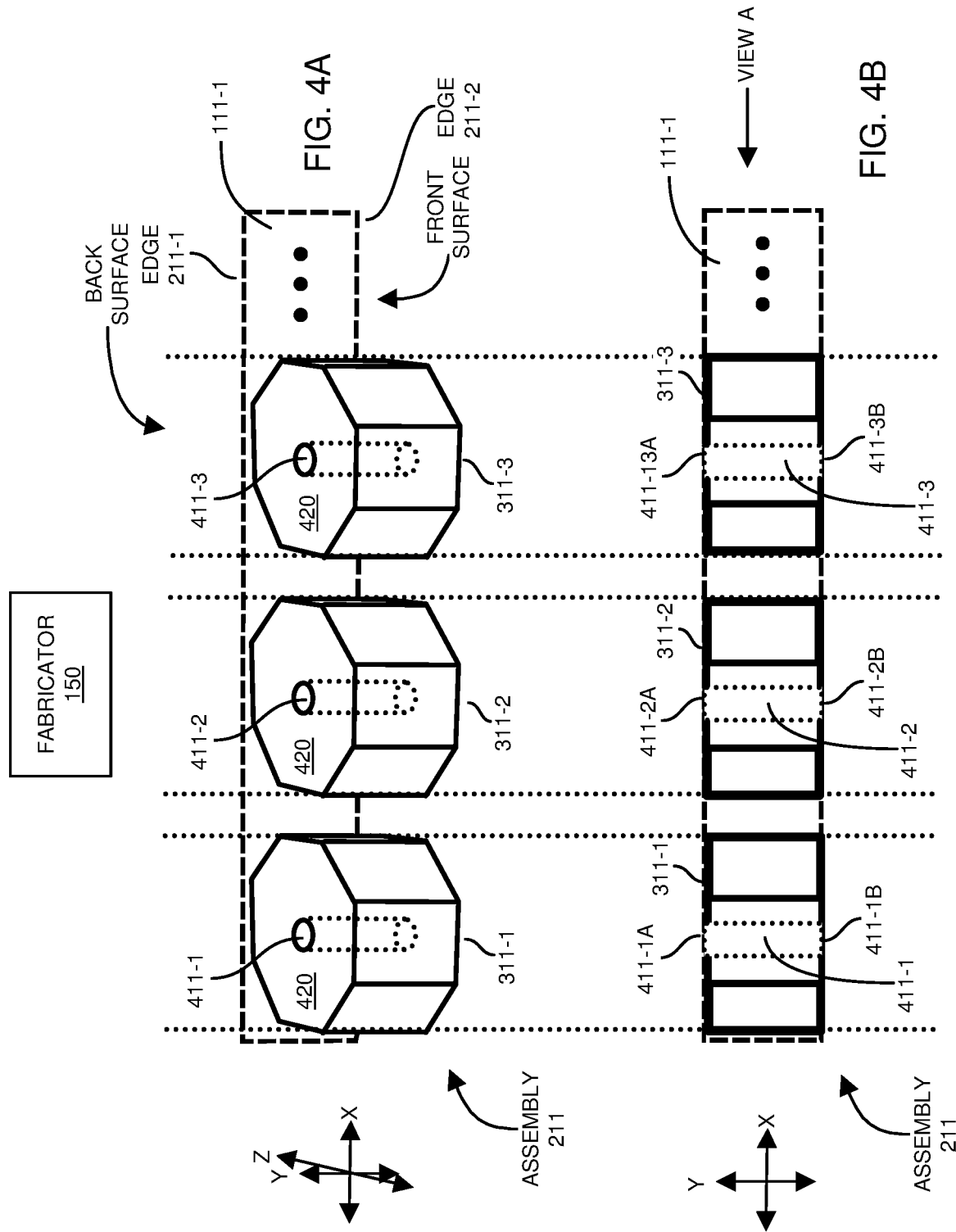
FIGS. 4A and 4B are example diagrams illustrating fabrication of the first assembly to include multiple inductor devices affixed to a respective circuit substrate as discussed herein.

FIG. 4A is an example 3-D diagram illustrating fabrication of the first assembly to include multiple inductor devices affixed to a respective circuit substrate as discussed herein. FIG. 4B is an example side view diagram illustrating fabrication of the first assembly to include multiple inductor devices affixed to a respective circuit substrate as discussed herein.

In this example, the fabricator 150 affixes the inductor device 311-1 (such as an instance of the circuitry 311) to a front face (first surface) of the circuit board 111-1. The inductor device 311-1 includes an electrically conductive path 411-1 surrounded by magnetic permeable material 420.

More specifically, the first circuitry 311 affixed to the first circuit board 111-1 may be implemented as an inductor device 311-1. The inductor device 311-1 may be fabricated to include an electrically conductive path 411-1 extending through a core of the magnetic permeable material 420. The electrically conductive path 411-1 may be electrically conductive material (such as metal) extending between the first axial end 411-1A of the inductor device 311-1 and the second axial end 411-1B of the inductor device 311-1; the electrically conductive path 411-1 of the inductor device 311-1 may be enveloped by the magnetic permeable material 420 between the first axial end 411-1A and the second axial end 411-1B.

Note that the electrically conductive path 411-1 may be implemented as a cylindrical body (or other suitable shape) of material fabricated from the electrically conductive material such as metal.

The circuitry 311-2 affixed to the first circuit board 111-1 via fabricator 150 may be implemented as an inductor device. The inductor device may be fabricated to include an electrically conductive path 411-2 and magnetic permeable material 420. The electrically conductive path 411-2 may be electrically conductive material (such as metal) extending between the first axial end 411-2A of the inductor device 311-2 and the second axial end 411-2B of the inductor device 311-2; the electrically conductive path 411-2 of the inductor device 311-2 may be enveloped by the magnetic permeable material 420 between the first axial end 411-2A and the second axial end 411-2B.

Note that the electrically conductive path 411-1 may be implemented as a cylindrical body of material fabricated from the electrically conductive material such as metal.

The circuitry 311-3 affixed to the first circuit board 111-1 may be implemented as an inductor device. The inductor device may be fabricated to include an electrically conductive path 411-3 and magnetic permeable material 420. The electrically conductive path 411-3 may be electrically conductive material (such as metal) extending between the first axial end 411-3A of the inductor device 311-3 and the second axial end 411-3B of the inductor device 311-3; the electrically conductive path 411-3 of the inductor device 311-3 may be enveloped by the magnetic permeable material 420 between the first axial end 411-3A and the second axial end 411-3B.

Note that the electrically conductive path 411-3 may be implemented as a cylindrical body or other suitable shape of material fabricated from the electrically conductive material such as metal.

In a similar manner, the fabricator 150 can be configured to affix any number of the inductor devices to a respective circuit board to produce a sub-assembly 211.

Other sub-assemblies such as assembly 212, assembly 213, assembly 214, etc., may be fabricated in a similar manner as assembly 211. Such assemblies are the building blocks of other assemblies as discussed herein.

Figure 5:
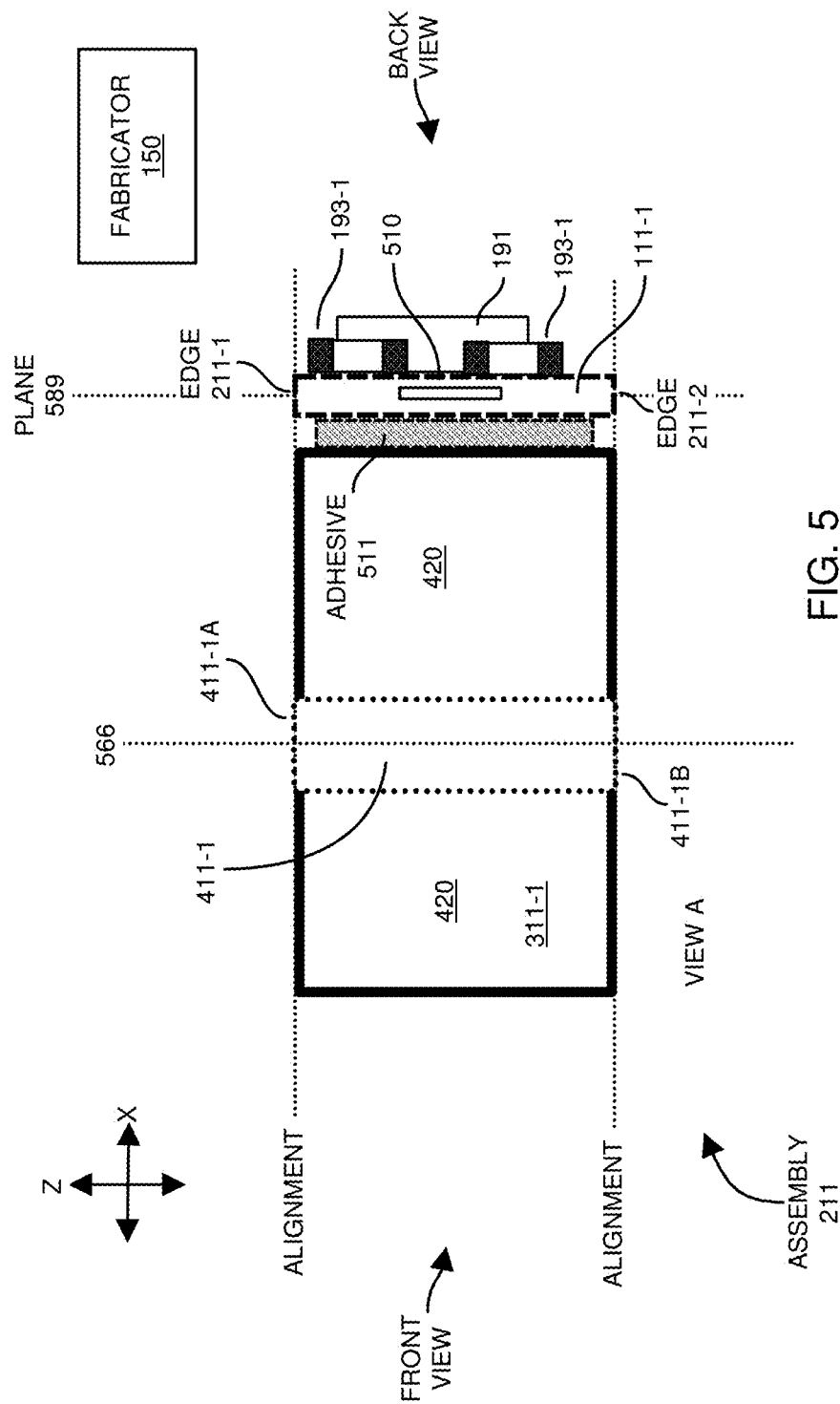
FIG. 5 is an example side view diagram illustrating a circuit assembly including a sequence of inductor devices as described herein.

FIG. 5 is an example side view diagram illustrating a circuit assembly and alignment as described herein. Note that the view of assembly in FIG. 5 is view A is from a perspective shown in FIG. 4B along a length of the circuit board 111-1.

As shown in FIG. 5, the assembly 211 may include one or more circuits 510 such as sub-circuits (such as semiconductor chips, discrete components, etc.) embedded in the circuit board 111-1.

As further shown, the center of the electrically conductive path 411-1 through inductor device (such as circuitry 311-1) is disposed along axis 566. The axis 556 is disposed along a length at center of the cylindrical body 411-1 between the first axial end 411-1A and the second axial end 411-1B. The axis 556 may be substantially parallel to a plane 567 in which the circuit board 111-1 resides.

The circuitry 311-1 such as an inductor device may be affixed to the circuit board 111-1 in any suitable manner. For example, the apparatus (one or more assemblies) as discussed herein may further include a layer of material such as adhesive 511 disposed between the magnetic permeable material 420 or surface of the circuitry 311-1 (such as inductor device) and a surface of the circuit board 111-1. The layer of material (adhesive 511) affixes the inductor device 311-1 to the circuit board 111-1. Components such as 193-1, 191, 192, etc., are affixed to a back surface of the circuit board 111-1 as previously discussed.

Figure 6:
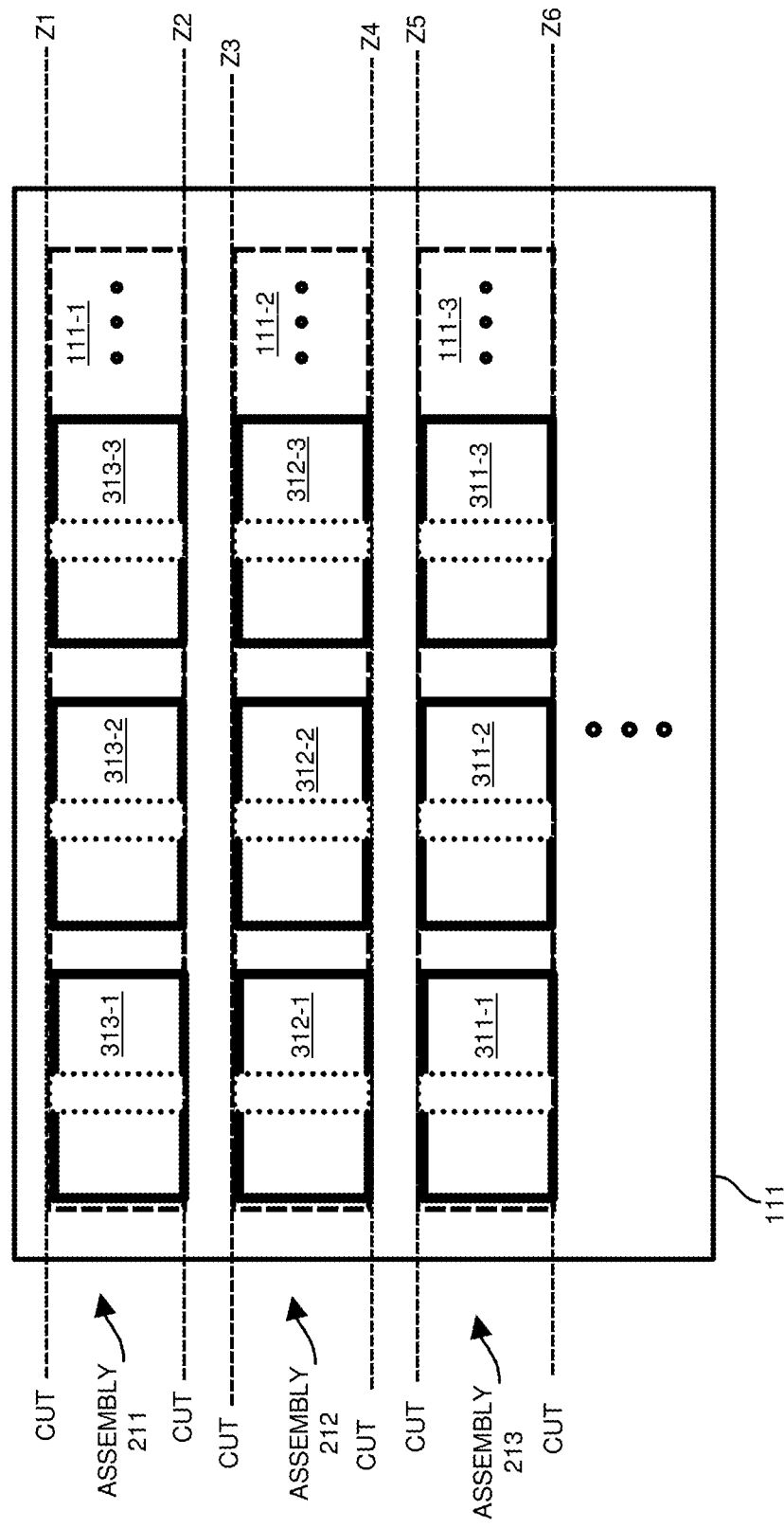
FIG. 6 is an example top view diagram illustrating fabrication of multiple subassemblies from a circuit substrate populated with inductor devices as described herein.

FIG. 6 is an example top view diagram illustrating fabrication of multiple subassemblies from a circuit substrate populated with inductor devices as described herein.

In this example, the inductor devices are affixed to a respective surface of the circuit board 111 prior to the fabricator 150 making planar cuts along plane Z1, plane Z2, plane Z3, plane Z4, plane Z5, plane Z6, etc. The planar cuts may ensure the alignment of the edges of the circuit boards with the corresponding circuitry affixed to the circuit board in a manner as discussed herein.

For example, first axial ends of circuitry 311-1, 311-2, 311-3, etc., align along edge of circuit board 111-1 along axis Z1; second axial ends of circuitry 311-1, 311-2, 311-3, etc., align along edge of circuit board 111-1 along axis Z2.

First axial ends of circuitry 312-1, 312-2, 312-3, etc., align along edge of circuit board 111-2 along axis Z3; second axial ends of circuitry 312-1, 312-2, 312-3, etc., align along edge of circuit board 111-2 along axis Z4.

First axial ends of circuitry 313-1, 313-2, 313-3, etc., align along edge of circuit board 111-3 along axis Z5; second axial ends of circuitry 313-1, 313-2, 313-3, etc., align along edge of circuit board 111-3 along axis Z6.

Thus, respective assemblies 211, 212, 213, etc., circuit board fabricated in any suitable manner.

Figure 7:
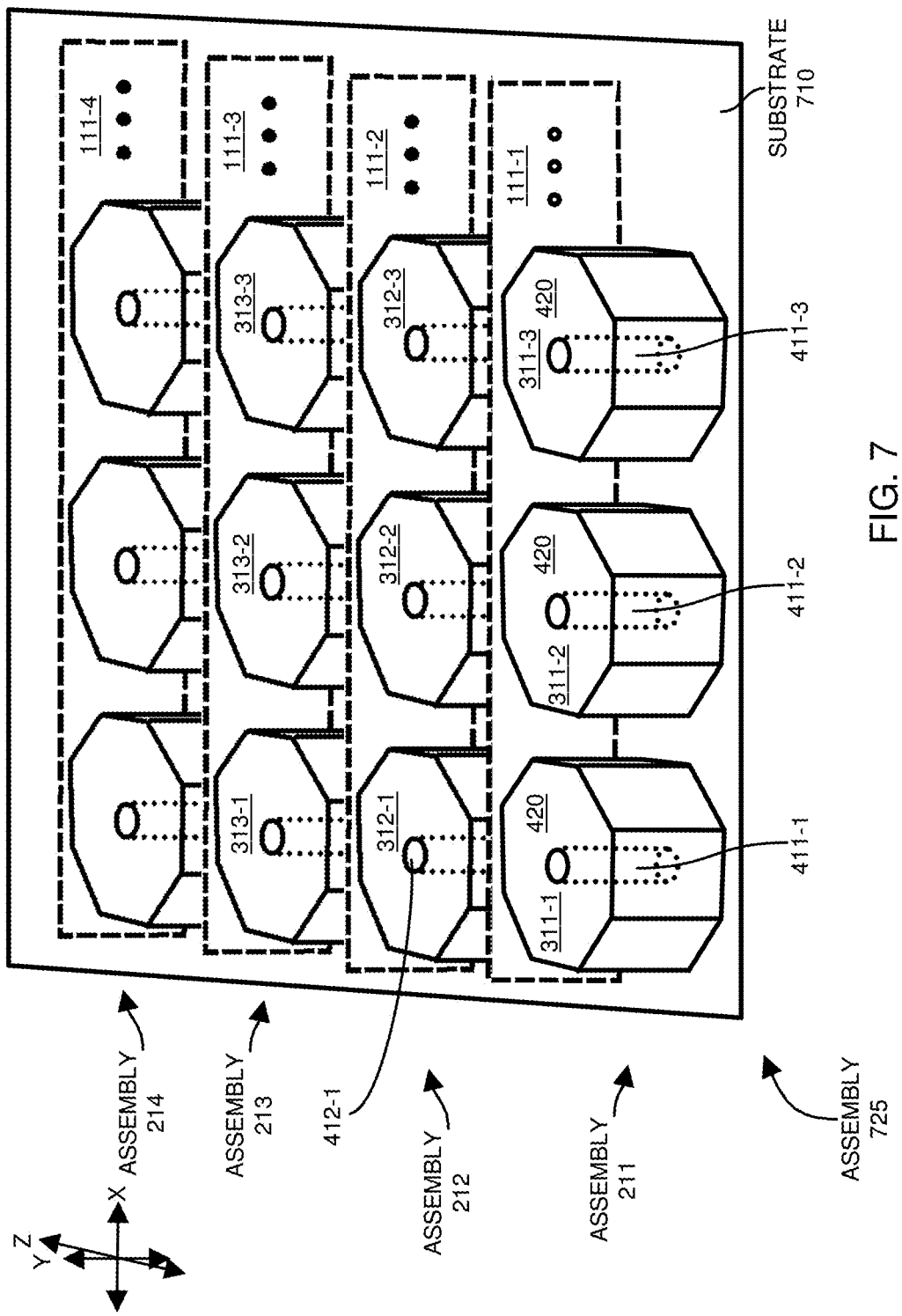
FIG. 7 is an example three-dimensional view diagram illustrating population of a substrate with multiple assemblies as described herein.

FIG. 7 is an example three-dimensional view diagram illustrating population of a substrate with multiple assemblies as described herein.

In this example, the assemblies 211, 212, 213, and 214 are disposed in parallel and are coupled to the substrate 710 (such as a planar substrate). The fabricator 150 can be configured to produce the assembly 725 to include a second substrate (such as a planar substrate) on a top surface of the assembly 725. See further figures showing a side view of multiple assemblies (211, 212, etc.) sandwiched between the substrate 710 and substrate 810.

Figure 8:
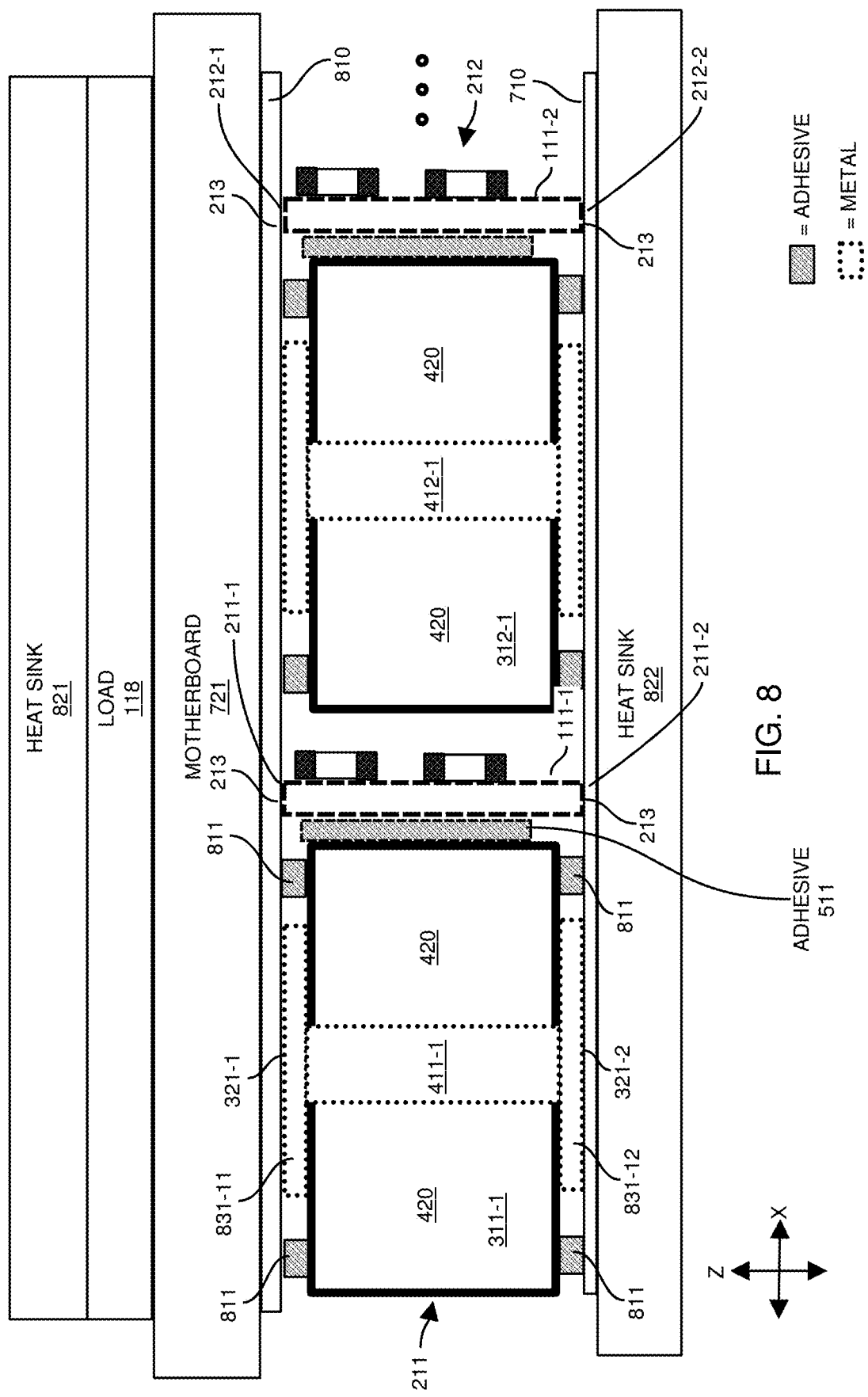
FIG. 8 is an example diagram illustrating implementation of multiple subassemblies in a power delivery system as described herein.

FIG. 8 is an example diagram illustrating implementation of multiple subassemblies in a power delivery system as described herein.

In this example, the assembly 825 includes the first assemblies (211, 212, etc.) as previously discussed as well as a first substrate 710 and a second substrate 810. Each of the assemblies is fabricated in a similar manner. Multiple assemblies are disposed side by side in FIG. 8 between substrates 710 and 810.

The first connector elements 213 on the first edge 211-1 of the first assembly 211 may be connected to nodes of the substrate 810; the first axial end of the electrically conductive path 411-1 associated with the first circuitry 311-1 such as first inductor device may be connected to a node of the substrate 810 via electrically conductive path 831-11 (such as solder or other suitable material); the second connector elements 213 on the second edge 211-2 may be connected to respective nodes of the substrate 710; the second axial end of the first circuitry such as inductor device 311-1 may be connected to a respective node of the substrate 710 via electrically conductive path 831-12 (such as solder or other suitable material). Circuit paths 195-1, 195-2, etc., provide connectivity between nodes of the substrate 710 and nodes of the substrate 810.

Note further that the circuit board 710 may reside in a first plane; the circuit board 810 may reside in a second plane. Yet further, note that the substrate 710 may be disposed substantially parallel to the substrate 810; the circuit board 111-1 may be disposed substantially parallel to circuit board 111-2; and both the circuit board 111-1 and the circuit board 111-2 may be disposed substantially orthogonal to the substrate 810 and/or the substrate 710.

The inductor device 311-1 optionally includes electrically conductive path 831-11 disposed at axial end 321-1 and electrically conductive path 831-12 disposed at axial end 321-2. Thus, the cross sectional areas/regions of the electrically conductive path (combination of electrically conductive path 411-1, electrically conductive path 831-11, and electrically conductive path 831-12) may be enlarged at the first axial end 321-1 and the second axial end 321-2 with respect to a cross sectional area of the electrically conductive path 411-1 at a location between the first axial end and the second axial end. In other words, the electrically conductive path 831-11 and electrically conductive path 831-12 is wider than the electrically conductive path 411-1.

Each of the electrically conductive paths 411-1, 411-2, 411-3, . . . , 412-1, 412-2, 412-3, . . . , can be configured to supply respective current and a corresponding output voltage to the load 118 and/or motherboard 721.

Components 193-1 such as capacitors can be configured to store the output voltage and/or input voltage associated with respective power converter circuitry. Note further that components 193-1 disposed on respective vertical circuit boards (circuit boards 111) may include any components such as capacitors, resistors, inductors, etc., connected in any circuit board configuration on front or back sides of each respective vertical circuit board (such as circuit board 111-1, circuit board 111-2, circuit board 111-3, etc.). A combination of the first edge 211-1 of the circuit board 111-1, the first axial end 321-1 of the inductor device (circuitry 311-1), the first edge 212-1 of the circuit board 111-2, first axial end of the inductor device (circuitry 312-1) may reside in a first plane; a combination of the second edge 211-2 of the circuit board 111-1, the second axial end 321-2 of the inductor device (circuitry 311-1), the second edge 212-2 of the circuit board 111-2, second axial end of the inductor device (circuitry 312-1) may reside in a second plane.

The first plane may be disposed substantially parallel to the second plane. For example, the bottom surface of the substrate 810 resides in the first plane and is in contact with the assemblies 211, 212, etc., and corresponding components. The top surface of the substrate 710 resides in the second plane and is in contact with the assemblies 211, 212, etc., and corresponding components.

As previously discussed, the circuit board 111-1 can be configured to include traces or conductive paths (circuit paths 195-1) extending between the edge 211-1 and the edge 211-2. One or more of the circuit paths 195-1 on circuit board 111-1 can be configured to support a high current from the load 118 to a ground reference of the substrate 710. In such an instance, the component 311-1 (inductor device) conveys current to the load 118. One or more of the circuit paths 195-1 in the circuit board 111-1 provide a high current return path for the current from the load 118 back to the substrate 710 for each implementation of power converter circuitry.

Figure 9:
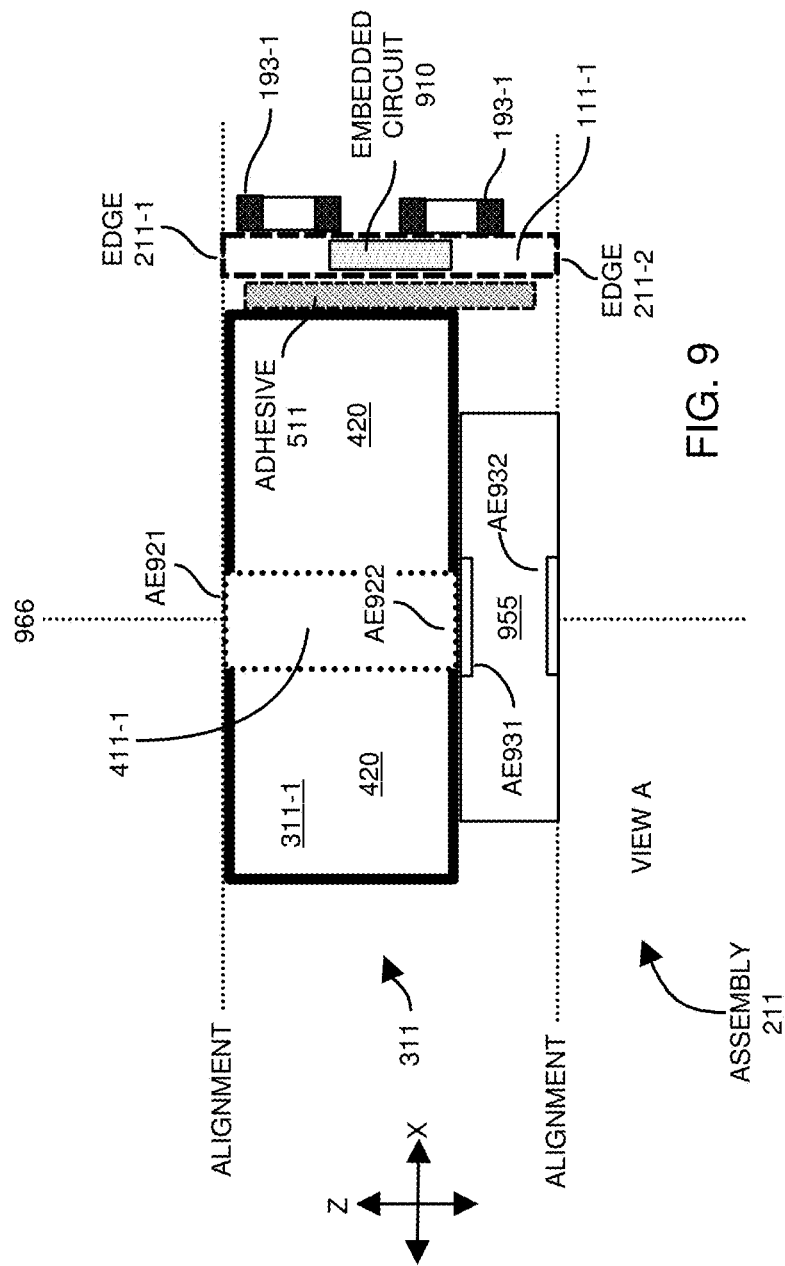
FIG. 9 is an example side view diagram illustrating fabrication of a sub-assembly including a serial connection of inductor device and circuitry as described herein.

FIG. 9 is an example side view diagram illustrating fabrication of a sub-assembly including a serial connection of inductor device and circuitry as described herein.

In this example, the sequence of circuitry 311-1, 311-2, 311-3, etc., affixed to the circuit board 111-1 may include a series connection of multiple components such as circuitry 311-1 and power converter circuitry 955 connected between the first axial end AE921 and the second axial end AE932 of circuit 311. The axial end AE921 of the electrically conductive path 411-1 aligns with the edge 211-1. The axial end AE932 of the circuit 955 aligns with the edge 211-2. The axial end AE932 and corresponding node of the electrically conductive path 411-1 is connected to the axial end AE931 of the circuit 955 (such as power converter circuitry).

As further shown, the assembly 211 may include one or more sub-circuits 910 (such as semiconductor chips, discrete components, power converter controller circuitry, etc.) embedded in the first circuit board 111-1.

Note again that each of the assemblies 211, 212, 213, etc., may be fabricated in a similar manner.

Figure 10:
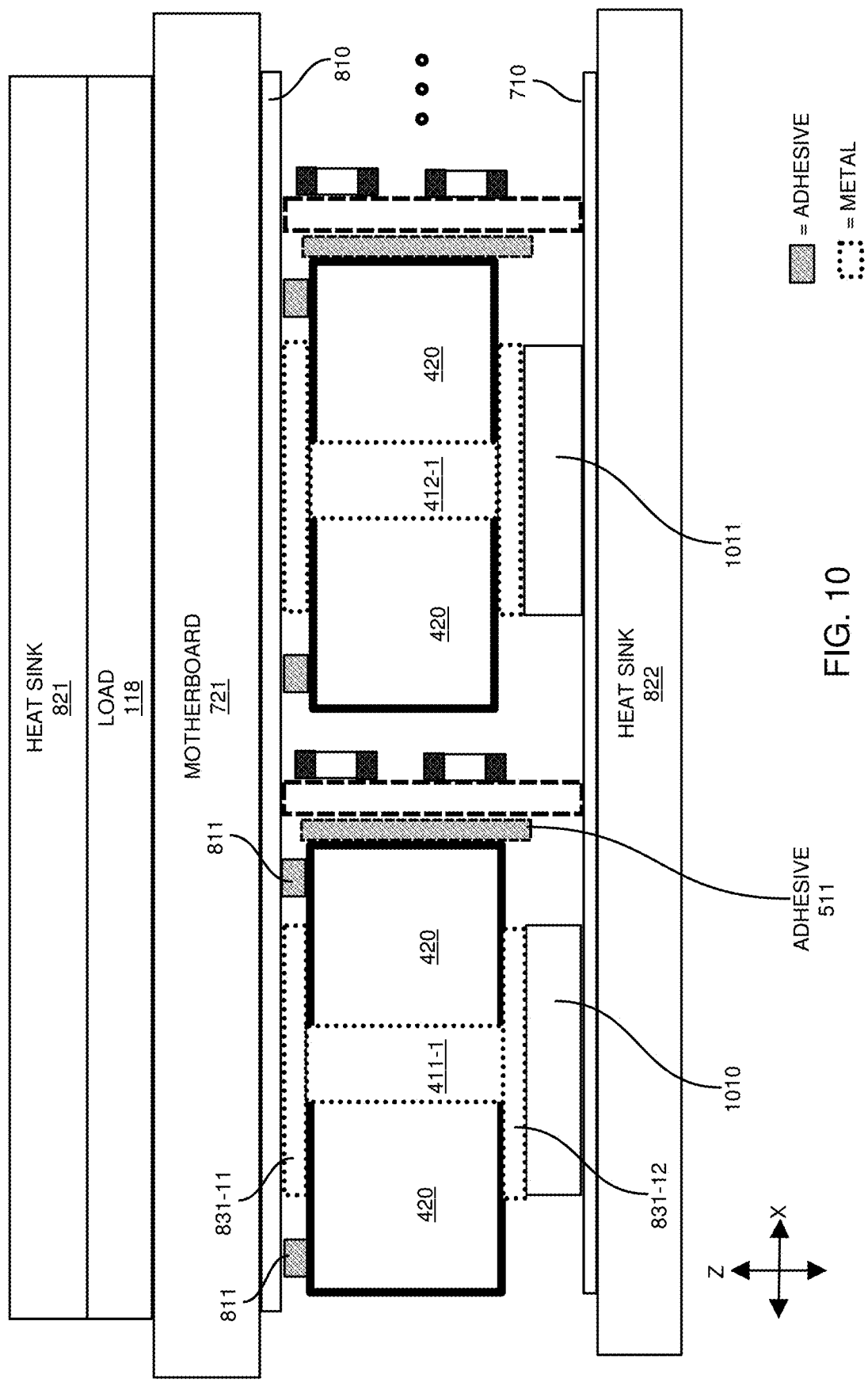
FIG. 10 is an example diagram illustrating implementation of multiple subassemblies in a power delivery system as described herein.

FIG. 10 is an example diagram illustrating implementation of multiple subassemblies in a power delivery system as described herein.

The implementation of system 1000 in FIG. 10 is the same as that shown in FIG. 8. However, a series combination of circuit 311 (such as an inductor device) and supplemental circuitry 1010 (such as power converter controller circuitry) is disposed in series between the substrate 710 and substrate 810.

Figure 11:
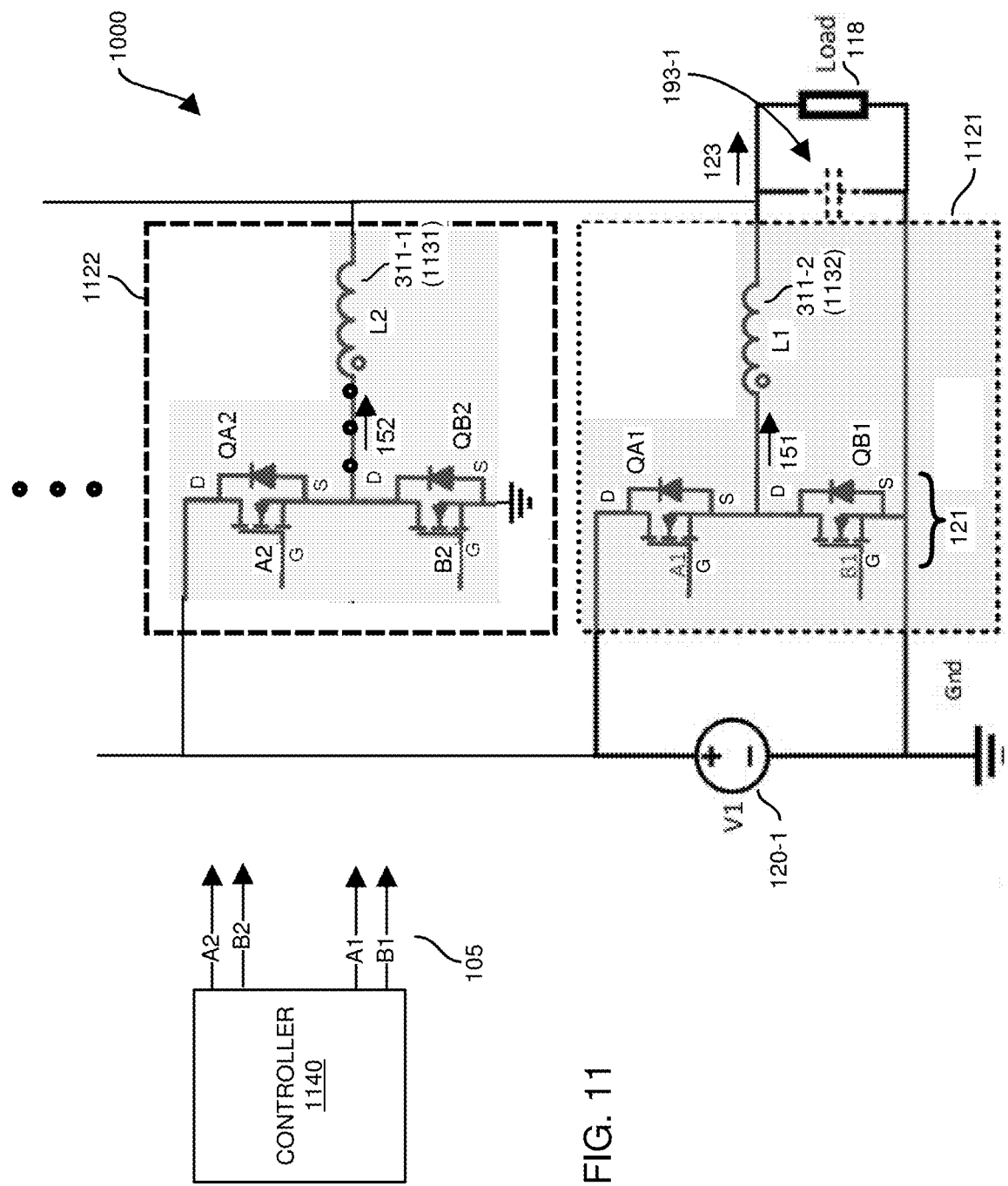
FIG. 11 is an example diagram illustrating connectivity of circuit components in a power supply including one or more inductor devices as discussed herein.

FIG. 11 is an example diagram illustrating connectivity of circuit components in a power supply including one or more assemblies and corresponding inductor devices as discussed herein.

In this non-limiting example, the power supply 1100 includes controller 1140 (i.e., power converter controller circuitry) and multiple phases 1121 and 1122 that collectively generate a respective output voltage 123 (output current) to power load 118 based on current through one or more inductive paths 1131, 132, etc. such as inductor devices 311-1, 311-2, etc. The load 118 can be any suitable circuit such as CPUs (Central Processing Units), GPUs and ASICs (such those including one or more Artificial Intelligence Accelerators), etc., which can be located on stand-alone circuit board.

Note that power supply 1100 can include any number of phases. If desired, the phases can be split such that the first phase 1121 powers a first load independent of the second phase 1122 powering a second load. Alternatively, the combination of phase 1121 and phase 1122 drive the same load 118.

As shown, a combination of the phase 1121 and phase 1122 power the same load 118. Phase 1121 includes switch QA1, switch QB1, and inductive path 1131 such as circuitry 311-1 (such as one or more inductor devices). Phase 1122 includes switch QA2, switch QB2, and inductive path 1132 such as circuitry 311-2 (such as one or more inductor devices).

Further in this example, the voltage source 120-1 supplies voltage V1 (such as 6 VDC or any suitable voltage) to the series combination of switch QA1 (such as a high-side switch) and switch QB1 (such as a low-side switch).

The combination of switch QA1 and QB1 as well as inductive path 1131 may operate in accordance with a buck converter topology to produce the output voltage 123.

Further in this example, note that the drain node (D) of switch QA1 is connected to receive voltage V1 provided by voltage source 120-1. The source node (S) of switch QA1 is coupled to the drain node (D) of switch QB1 as well as the input node of inductive path 1131. The source node of switch QB1 is coupled to ground. The output node of the inductive path 1131 is coupled to the load 118.

Yet further in this example, the drain node of switch QA2 of phase 1122 is connected to receive voltage V1 provided by voltage source 120-1. The source node (S) of switch QA2 is coupled to the drain node (D) of switch QB2 as well as the input node of inductive path 1132. The source node of switch QB2 is coupled to ground. The output node of the inductive path 1132 is coupled to the load 118.

As previously discussed, the combination of the phases 221 and 222 produces the output voltage 123 that powers load 118. That is, the inductive path 1131 produces output voltage 123; inductive path 1132 produces output voltage 123.

During operation, as shown, controller 1140 produces control signals 105 (such as control signal A1 and control signal B1) to control states of respective switches QA1 and QB1. For example, the control signal A1 produced by the controller 1140 drives and controls the gate node of switch QA1; the control signal B1 produced by the controller 1140 drives and controls the gate node of switch QB1.

Additionally, controller 1140 produces control signals A2 and B2 to control states of switches QA2 and QB2. For example, the control signal A2 produced by the controller 1140 drives and controls the gate node of switch QA2; the control signal B2 produced by the controller 1140 drives and controls the gate node of switch QB2.

The controller 1140 may control the phases 1121 and 1122 to be 180 degrees or other suitable value out of phase with respect to each other.

As is known with buck converters, in phase 1121, activation of the high-side switch QA1 to an ON state while switch QB1 is deactivated (OFF) couples the input voltage V1 to the input of the inductive path 1131, causing an increase (such as ramped) in amount of current provided by the inductive path 1131 to the load 118. Conversely, activation of the low-side switch QB1 to an ON state while switch QA1 is deactivated (OFF) couples the ground reference voltage to the input of the inductive path 1131, causing a decrease (such as ramped) in amount of current provided by the inductive path 1131 to the load 118. The controller 1140 monitors a magnitude of the output voltage 123 and controls switches QA1 and QB1 such that the output voltage 123 stays within a desired voltage range.

Via phase 222, in a similar manner, activation of the high-side switch QA2 to an ON state while switch QB2 is deactivated (OFF) couples the input voltage V1 to the input of the inductive path 1132 causing an increase in amount of current provided by the inductive path 1132 to the load 118. Conversely, activation of the low-side switch QB2 to an ON state while switch QA2 is deactivated (OFF) couples the ground reference voltage to the input of the inductive path 1132, causing a decrease in amount of current provided by the inductive path 1132 to the load 118. The controller 1140 monitors a magnitude of the output voltage 123 and controls switches QA2 and QB2 such that the output voltage 123 stays within a desired voltage range.

Referring again to FIG. 7, note further that the controller 1140 (i.e., power converter controller circuitry) can be disposed at any suitable location in the assembly 725. For example, each of multiple instances of the controller 1140 may be disposed as circuitry (such as via circuitry 191-1, 191-2, . . . 192-1, 192-2, etc.) coupled to or embedded in each of the vertical circuit boards 111-1, 111-2, 111-3, etc.

Figure 12:
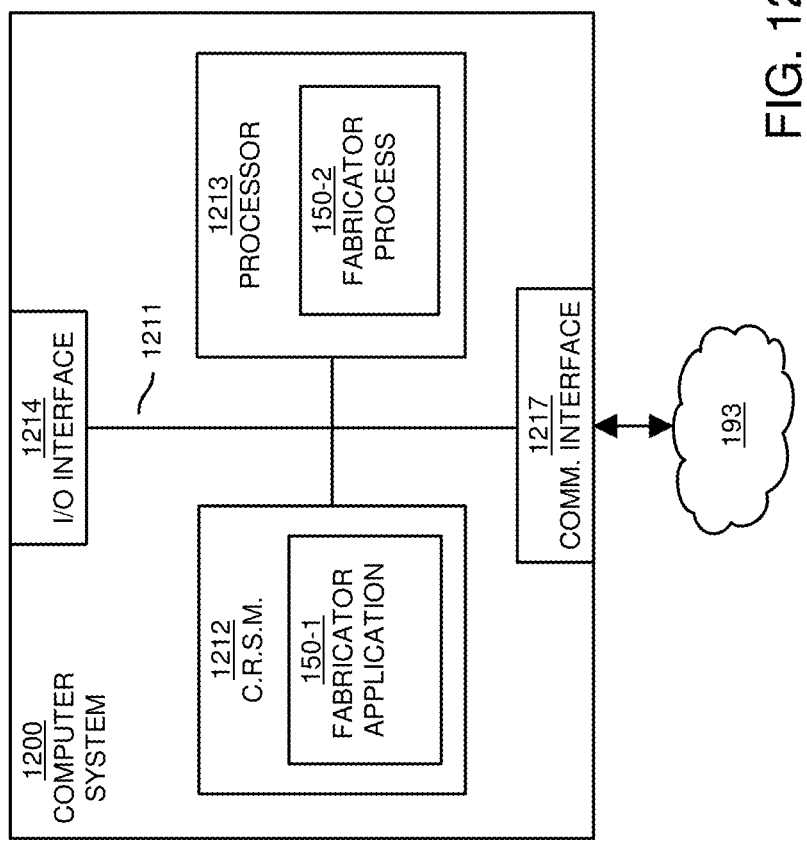
FIG. 12 is an example diagram illustrating computer processor hardware (such as fabrication equipment) and related software instructions that execute one or more fabrication methods as discussed herein.

FIG. 12 is an example diagram illustrating computer processor hardware (such as fabrication equipment) and related software instructions that execute one or more fabrication methods as discussed herein.

As shown, computer system 1200 (such as implemented by any of one or more resources such as a fabricator) of the present example includes an interconnect 1211 that couples computer readable storage media 1212 such as a non-transitory type of media (or hardware storage media) in which digital information can be stored and retrieved, a processor 1213 (e.g., computer processor hardware such as one or more processor devices), I/O interface 1214 (e.g., to output control signals to the power converter phases, monitor current, etc.), and a communications interface 1217.

I/O interface 1214 provides connectivity to any suitable circuitry such as power supply 100 and corresponding power converter phases 111, 112, etc.

Computer readable storage medium 1212 can be any hardware storage resource or device such as memory, optical storage, hard drive, floppy disk, etc. The computer readable storage medium 1212 stores instructions and/or data used by the fabricator application 150-1 to perform any of the operations as described herein.

Further in this example, communications interface 1217 enables the computer system 1200 and processor 1213 to communicate over a resource such as network 190 to retrieve information from remote sources and communicate with other computers.

As shown, computer readable storage media 1212 (such as computer-readable storage hardware) is encoded with fabricator application 150-1 (e.g., software, firmware, etc.) executed by processor 1213. Fabricator application 150-1 can be configured to include instructions to implement any of the operations as discussed herein.

During operation, processor 1213 may access computer readable storage media 1212 via the use of interconnect 1211 in order to launch, run, execute, interpret or otherwise perform the instructions in fabricator application 150-1 stored on computer readable storage medium 1212.

Execution of the fabricator application 150-1 produces processing functionality such as fabricator process 150-2 in processor 1213. In other words, the fabricator process 150-2 associated with processor 1213 represents one or more aspects of executing fabricator application 150-1 within or upon the processor 1213 in the computer system 1200.

In accordance with different examples, note that computer system 1200 can be a micro-controller device, logic, hardware processor, hybrid analog/digital circuitry, etc., configured to control a power supply and perform any of the operations as described herein.

Functionality supported by the different resources will now be discussed via flowchart in FIG. 13. Note that the steps in the flowcharts below can be executed in any suitable order.

Figure 13:
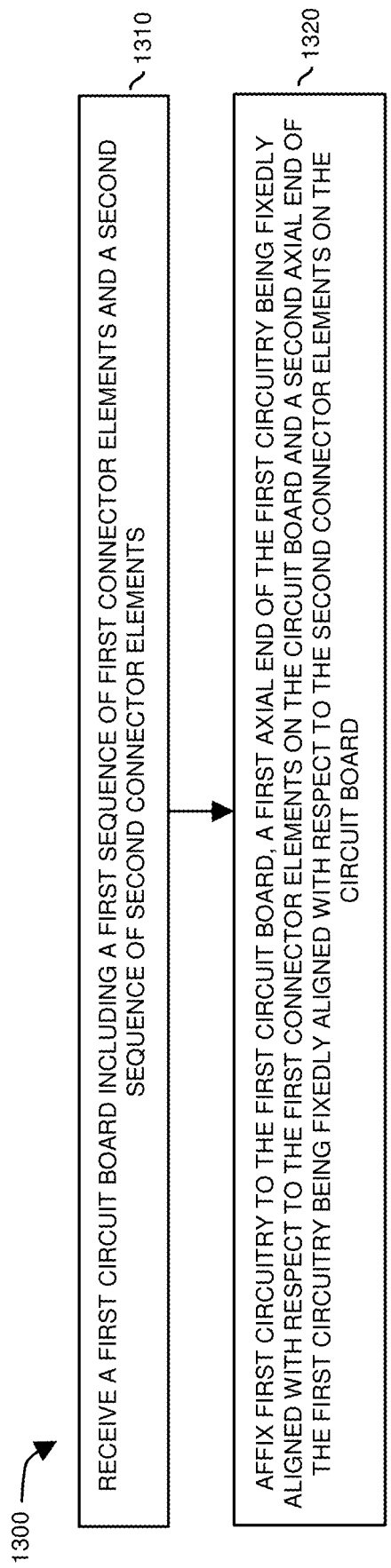
FIG. 13 is an example diagram illustrating a fabrication method as discussed herein.

FIG. 13 is a flowchart 1300 illustrating an example method as discussed herein. Note that there will be some overlap with respect to concepts as discussed above.

In processing operation 1310, the fabricator 150 receives a first circuit board including a first sequence of first connector elements and a second sequence of second connector elements.

In processing operation 1320, the fabricator 150 affixes first circuitry to the first circuit board. A first axial end of the first circuitry is fixedly aligned with respect to the first connector elements on the circuit board and a second axial end of the first circuitry is fixedly aligned with respect to the second connector elements on the circuit board.

Note again that techniques herein are well suited for use in circuit assembly applications such as those providing power delivery to one or more loads. However, it should be noted that the disclosure of matter herein is not limited to use in such applications and that the techniques discussed herein are well suited for other applications as well.

While this invention has been particularly shown and described with references to preferred aspects thereof, it will be understood by those skilled in the art that various changes in form and details may be made therein without departing from the spirit and scope of the present application as defined by the appended claims. Such variations are intended to be covered by the scope of this present application. As such, the foregoing description in the present disclosure is not intended to be limiting. Rather, any limitations to the invention are presented in the following claims.

The invention claimed is:

1. A first assembly comprising:
   a first circuit board including first connector elements disposed on a first edge of the first circuit board and second connector elements disposed on a second edge of the first circuit board, the first edge disposed opposite the second edge on the first circuit board;
   first circuitry affixed to the first circuit board;

wherein the first edge of the first circuit board aligns with a first axial end of the first circuitry and the second edge of the first circuit board aligns with a second axial end of the first circuitry; and wherein the first circuitry affixed to the first circuit board is an inductor device, the inductor device comprising an electrically conductive path and magnetic permeable material, the electrically conductive path being electrically conductive material extending between the first axial end of the first circuitry and the second axial end of the first circuitry, the electrically conductive path of the inductor device enveloped by the magnetic permeable material.

2. The first assembly as in claim 1, wherein the electrically conductive path is a cylindrical body fabricated from the electrically conductive material; and wherein an axis disposed along a length of the cylindrical body between the first axial end and the second axial end is substantially parallel to a plane in which the first circuit board resides.

3. The first assembly as in claim 1, wherein cross sectional areas of the electrically conductive path are enlarged at the first axial end and the second axial end with respect to a cross sectional area of the electrically conductive path at a location between the first axial end and the second axial end.

4. The first assembly as in claim 1 further comprising:
a layer of material disposed between the magnetic permeable material of the inductor device and a surface of the first circuit board, the layer of material affixing the inductor device to the first circuit board.

5. The first assembly as in claim 1, wherein the first circuitry affixed to the first circuit board includes a series connection of the inductor device and power converter circuitry between the first axial end and the second axial end.

6. The first assembly as in claim 5, wherein the first axial end of the first circuitry is electrically isolated from the first connector elements disposed on the first edge of the first circuit board; and wherein the second axial end of the first circuitry is electrically isolated from the second connector elements disposed on the second edge of the first circuit board.

7. The first assembly as in claim 6, wherein the inductor device is operative to convey first current from the first axial end of the first circuitry through the first electrically conductive path of the inductor device and the second axial end of the first circuitry to a load; and wherein the first circuit board includes a second electrically conductive path connected between the second connector elements and the first connector elements, the second electrically conductive path operative to receive the first current from the load and convey the first current from the load through the second connector elements and the second electrically conductive path to the first connector elements.

8. The first assembly as in claim 1 further comprising:
supplemental circuitry coupled to a second surface of the first circuit board, the second surface disposed opposite the first surface.

9. The first assembly as in claim 1 further comprising:
a chip embedded in the first circuit board.

10. The first assembly as in claim 1, wherein each of the first connector elements on the first edge of the first circuit board includes a respective cavity; and wherein each of the second connector elements on the second edge of the connector elements includes a respective cavity.

11. A second assembly comprising:
the first assembly of claim 1;
a first substrate;
a second substrate; and
wherein the first connector elements on the first edge are connected to the first substrate;
wherein the first axial end of the first circuitry is connected to the first substrate;
wherein the second connector elements on the second edge are connected to the second substrate; and
wherein the second axial end of the first circuitry is connected to the second substrate.

12. The second assembly as in claim 11, wherein the first substrate is disposed substantially parallel to the second substrate;

wherein the first circuit board is disposed substantially parallel to a second circuit board; and wherein both the first circuit board and the second circuit board are disposed substantially orthogonal to the first substrate or the second substrate.

13. The first assembly as in claim 1, wherein a combination of: i) the first edge of the first circuit board, and ii) the first axial end of the first circuitry reside in a first plane; and wherein a combination of: i) the second edge of the first circuit board, and ii) the second axial end of the first circuitry reside in a second plane.

14. The first assembly as in claim 1, wherein the first axial end of the first circuitry is electrically isolated from the first connector elements disposed on the first edge of the first circuit board; and wherein the second axial end of the first circuitry is electrically isolated from the second connector elements disposed on the second edge of the first circuit board.

15. The first assembly as in claim 1,
wherein the first axial end of the first circuitry is physically spaced apart from the first connector elements disposed on the first edge of the first circuit board via a first portion of the magnetic permeable material; and wherein the second axial end of the first circuitry is physically spaced apart from the second connector elements disposed on the second edge of the first circuit board via a second portion of the magnetic permeable material.

16. The first assembly as in claim 1, wherein the magnetic permeable material includes a planar surface; and wherein the planar surface of the magnetic permeable material is affixed to the first circuit board.

17. The first assembly as in claim 1, wherein the first connector elements and the first axial end of the first circuitry are directly connected to a second circuit board; and wherein the second connector elements and the second axial end of the first circuitry are directly connected to nodes of a third circuit board.

18. The first assembly as in claim 17, wherein the first circuitry is operative to convey first current received from the second circuit board through the first circuitry to a load coupled to the third circuit board; and wherein the first circuit board includes a second electrically conductive path connected between the second connector elements and the first connector elements, the second electrically conductive path operative to: i) receive the first current from the load through the second connector elements, and ii) convey the first current through the second electrically conductive path to the first connector elements.

19. A first assembly comprising:
a first circuit board including first connector elements disposed on a first edge of the first circuit board and second connector elements disposed on a second edge of the first circuit board, the first edge disposed opposite the second edge on the first circuit board;
first circuitry affixed to the first circuit board;
second circuitry affixed to the first circuit board;
wherein the first edge of the first circuit board aligns with a first axial end of the first circuitry and the second edge of the first circuit board aligns with a second axial end of the first circuitry;
wherein a combination of the first edge of the first circuit board, the first axial end of the first circuitry, and a first axial end of the second circuitry reside in a first plane; and
wherein a combination of the second edge of the first circuit board, the second axial end of the first circuitry, and a second axial end of the second circuitry reside in a second plane.

20. The first assembly as in claim 19, wherein the first plane is parallel to the second plane.

21. The first assembly as in claim 19 further comprising:
first circuit paths extending between a first portion of the first connector elements on the first edge and a first portion of the second connector elements on the second edge, the first circuit paths disposed in the first circuit board adjacent the first circuitry; and
second circuit paths extending between a second portion of the first connector elements on the first edge and a second portion of the second connector elements on the second edge, the second circuit paths disposed in the first circuit board adjacent the second circuitry.

22. A method of fabricating a first assembly, the method comprising:
receiving a first circuit board including a first sequence of first connector elements disposed on a first edge of the first circuit board and a second sequence of second connector elements disposed on a second edge of the first circuit board, the first edge disposed opposite the second edge on the first circuit board;
affixing first circuitry to the first circuit board, wherein a first axial end of the first circuitry is fixedly aligned with respect to the first connector elements on the first circuit board and a second axial end of the first circuitry is fixedly aligned with respect to the second connector elements on the first circuit board;
affixing second circuitry to the first circuit board;
wherein the first edge of the first circuit board aligns with a first axial end of the first circuitry and a second edge of the first circuit board aligns with a second axial end of the first circuitry;
wherein a combination of the first edge of the first circuit board, the first axial end of the first circuitry, and a first axial end of the second circuitry reside in a first plane; and
wherein a combination of the second edge of the first circuit board, the second axial end of the first circuitry, and a second axial end of the second circuitry reside in a second plane.

23. The method as in claim 22 further comprising:
fabricating the first circuit board to include the first sequence of first connector elements and the second sequence of second connector elements.

24. The method as in claim 22 further comprising:
cutting the first circuit board along an axis of the first connector elements to produce a first edge of the first circuit board; and
cutting the first circuit board along an axis of the second connector elements to produce a second edge of the first circuit board.

25. The method as in claim 24, wherein the first circuit board is cut such that the first edge of the first circuit board is aligned with a first axial end of the first circuitry and the second edge of the first circuit board is aligned with a second axial end of the first circuitry, the first edge disposed opposite the second edge on the first circuit board.

26. The method as in claim 22, wherein the first circuitry affixed to the first circuit board is an inductor device fabricated to include an electrically conductive path and magnetic permeable material, the electrically conductive path being electrically conductive material extending between the first axial end of the first circuitry and the second axial end of the first circuitry, the electrically conductive material of the inductor device enveloped by the magnetic permeable material.

27. The method as in claim 26, wherein cross sectional areas of the electrically conductive paths are enlarged at the first axial end and the second axial end with respect to a cross sectional area of the electrically conductive path at a location disposed between the first axial end and the second axial end.

* * * * *